(12) United States Patent
Mrugalski et al.

(10) Patent No.: US 8,347,159 B2
(45) Date of Patent: Jan. 1, 2013

(54) COMPRESSION BASED ON DETERMINISTIC VECTOR CLUSTERING OF INCOMPATIBLE TEST CUBES

(75) Inventors: Grzegorz Mrugalski, Swarzedz (PL); Nilanjan Mukherjee, Wilsonville, OR (US); Janusz Rajski, West Linn, OR (US); Dariusz Czysz, Wielkopolski (PL); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 267 days.

(21) Appl. No.: 12/718,813

(22) Filed: Mar. 5, 2010

(65) Prior Publication Data
US 2010/0229060 A1 Sep. 9, 2010

Related U.S. Application Data

(60) Provisional application No. 61/157,684, filed on Mar. 5, 2009.

(51) Int. Cl.
*G06F 11/00* (2006.01)
(52) U.S. Cl. .................................. 714/738; 714/733
(58) Field of Classification Search .................. 714/724, 714/728, 739, 738, 733
See application file for complete search history.

(56) References Cited

U.S. PATENT DOCUMENTS

| 6,950,974 B1 * | 9/2005 | Wohl et al. .................... 714/733 |
| 7,302,626 B2 * | 11/2007 | Balakrishnan et al. ....... 714/738 |
| 7,610,527 B2 * | 10/2009 | Wang et al. .................... 714/724 |
| 7,647,540 B2 * | 1/2010 | Rajski et al. .................. 714/738 |
| 7,797,603 B2 * | 9/2010 | Rajski et al. .................. 714/738 |

OTHER PUBLICATIONS

C. Barnhart, et al., "Extending OPMISR beyond 10x scan test efficiency," IEEE Design and Test of Computers, vol. 19, No. 5, pp. 65-73, 2002.
S. Wang, K.J. Balakrishnan, and S.T. Chakradhar, "XWRC: Externally-loaded weighted random pattern testing for input test data compression," Proc. ITC, paper 24.2, 2005.
K.J. Balakrishnan and N.A. Touba, "Improving linear test data compression," IEEE Trans. VLSI, vol. 14, pp. 1227-1237, Nov. 2006.
Z. Wang and K. Chakrabarty, "Test data compression for IP embedded cores using selective encoding of scan slices," Proc. ITC, pp. 581-590, 2005.
I. Bayraktaroglu and A. Orailoglu, "Concurrent application of compaction and compression for test time and data vol-ume reduction in scan designs," IEEE Trans. Comput, vol. 52, pp. 1480-1489, Nov. 2003.
A. Chandra and K. Chakrabarty, "Test data compression and test resource partitioning for system-on-a-chip using fre-quency-directed run-length (FDR) codes," IEEE Trans. Comput., vol. 52, pp. 1076-1088, Aug. 2003.
A. Chandra and K. Chakrabarty, "System-on-a-chip test-data compression and decompression architectures based on Golomb codes," IEEE Trans. CAD, vol. 20, pp. 355-368, Mar. 2001.
D. Das and N.A. Touba, "Reducing test data volume using external/LBIST hybrid test patterns," Proc. ITC, pp. 115-122, 2000.
R. Dorsch and H.-J. Wunderlich, "Tailoring ATPG for em-bedded testing," Proc. ITC, pp. 530-537, 2001.

(Continued)

*Primary Examiner* — David Ton

(57) ABSTRACT

The test data compression scheme is based on deterministic vector clustering. Test cubes that feature many similar specified bits are merged into a parent pattern in the presence of conflicts. The parent pattern along with a control pattern and incremental patterns representing conflicting bits are encoded efficiently. A tri-modal decompressor may be used to decompress the test data.

19 Claims, 5 Drawing Sheets

OTHER PUBLICATIONS

V. Gherman, et al., "Efficient pattern mapping for determi-nistic logic BIST," Proc. ITC, pp. 48-56, 2004.

P.T. Gonciari, B.M. Al-Hashimi, and N. Nicolici, "Variable length input Huffman coding for system-on-a-chip test," IEEE Trans. CAD, vol. 22, pp. 783-796, Jun. 2003.

A.-W. Hakmi, et al., "Programmable deterministic built-in self-test," Proc. ITC, paper 18.1, 2007.

P. Wohl, J.A. Waicukauski, S. Patel, and M.B. Amin, "Efficient compression and application of deterministic patterns in a logic BIST architecture," Proc. DAC, pp. 566-569, 2003.

I. Hamzaoglu and J. Patel, "Reducing test application time for built-in self-test pattern generators," Proc. VTS, pp. 369-376, 2000.

I. Hamzaoglu and J. Patel, "Reducing test application time for full scan embedded cores," Proc. Int. Symp. On Fault Tolerant Computing, pp. 260-267, 1999.

P. Wohl, J.A. et al., "Efficient compression of deterministic patterns into multiple PRPG seeds," Proc. ITC, pp. 916-925, 2005.

S. Hellebrand, et al., "Built-in test for circuits with scan based on reseeding of multiple-polynomial linear feedback shift registers," IEEE Trans. on Comput., vol. 44, pp. 223-233, Feb. 1995.

S. Hellebrand, H.-G. Liang, and H.-J. Wunderlich, "A mixed mode BIST scheme based on reseeding of folding counters," Proc. ITC, pp. 778-784, 2000.

H.-J. Wunderlich and G. Kiefer, "Bit-flipping BIST," Proc. ICCAD, pp. 337-343, 1996.

H. Ichihara, A. Ogawa, T. Inoue, and A. Tamura, "Dynamic test compression using statistical coding," Proc. ATS, pp. 143-148, 2001.

H. Ichihara, K. Kinoshita, I. Pomeranz, and S.M. Reddy, "Test transformation to improve compaction by statistical encoding," Proc. Int. Conf. on VLSI Design, pp. 294-299, 2000.

A. Jas, J. Ghosh-Dastidar, and N.A. Touba, "Scan vector compression/decompression using statistical coding," Proc. VTS, pp. 114-120, 1999.

A. Jas and N.A. Touba, "Test vector decompression via cyclical scan chains and its application to testing core-based designs," Proc. ITC, pp. 458-464, 1998.

B. Keller, et al., "OPMISR: The foundation for compressed ATPG vectors," Proc. ITC, pp. 748-757, 2001.

B. Koenemann, "LFSR-coded test patterns for scan de-signs," Proc. European Test Conference, pp. 237-242, 1991.

B. Koenemann, "Care bit density and test cube clusters: multi-level compression opportunities," Proc. ICCD, pp. 320-325, 2003.

B. Koenemann, et al., "A SmartBIST variant with guaran-teed encoding," Proc. ATS, pp. 325-330, 2001.

C. Krishna, A. Jas, and N.A. Touba, "Test vector encoding using partial LFSR reseeding," Proc. ITC, pp. 885-893, 2001.

C.V. Krishna and N.A. Touba, "Reducing test data volume using LFSR reseeding with seed compression," Proc. ITC, pp. 321-330, 2002.

C.V. Krishna and N.A. Touba, "Adjustable width linear combinational scan vector decompression," Proc. ICCAD, pp. 863-866, 2003.

C.V. Krishna and N.A. Touba, "3-stage variable length con-tinuous-flow scan vector decompression scheme," Proc. VTS, pp. 79-86, 2004.

A. Würtenberger, C.S. Tautermann, and S. Hellebrand, "Data compression for multiple scan chains using dictionaries with corrections," Proc. ITC, pp. 926-935, 2004.

J. Lee, and N.A. Touba, "Combining linear and non-linear test vector compression using correlation-based rectangular coding," Proc. VTS, pp. 252-257, 2006.

L. Li, K. Chakrabarty, and N.A. Touba, "Test data compres-sion using dictionaries with selective entries and fixed length indices," ACM Trans. Design Automation of Elec-tronic Systems, vol. 8, No. 4, pp. 470-490, Oct. 2003.

H-G. Liang, S. Hellebrand, and H.-J. Wunderlich, "Two-dimensional test data compression for scan-based determi-nistic BIST," Proc. ITC, pp. 894-902, 2001.

S. Mitra and K.S. Kim, "XPAND: An efficient test stimulus compression technique," IEEE Trans. Comput., vol. 55, pp. 163-173, Feb. 2006.

G. Mrugalski, J. Rajski, and J. Tyszer, "Ring generators—new devices for embedded test applications," IEEE Trans. CAD, vol. 23, pp. 1306-1320, Sep. 2004.

E.H. Volkerink, A. Khoche, and S. Mitra, "Packet-based input test data compression techniques," Proc. ITC, pp. 154-163, 2002.

E.H. Volkerink and S Mitra, "Efficient seed utilization for reseeding based compression," Proc. VTS, pp. 232-237, 2003.

J. Rajski, et al., "Embedded deterministic test for low cost manufacturing test," Proc. ITC, pp. 301-310, 2002.

J. Rajski, J. Tyszer, M. Kassab, and N. Mukherjee, "Embed-ded deterministic test", IEEE Trans. CAD, vol. 23, pp. 776-792, May 2004.

J. Rajski, J. Tyszer, and N. Zacharia, "Test data decompres-sion for multiple scan designs with boundary scan," IEEE Trans. Comput., vol. 47, pp. 1188-1200, Nov. 1998.

W. Rao, I. Bayraktaroglu, and A. Orailoglu, "Test applica-tion time and volume compression through seed overlapping," Proc. DAC, pp. 732-737, 2003.

X. Sun, L. Kinney, and B. Vinnakota, "Combining diction-ary coding and LFSR reseeding for test data compression," Proc. DAC, pp. 944-947, 2004.

H. Tang, S.M. Reddy, and I. Pomeranz, "On reducing test data volume and test application time for multiple scan de-signs," Proc. ITC, pp. 1079-1088, 2003.

M. Tehranipoor, M. Nourani, and K. Chakrabarty, "Nine-coded compression technique for testing embedded cores in SoCs," IEEE Trans. VLSI, vol. 13, Jun. 2005, pp. 719-731.

N.A. Touba and E.J. McCluskey, "Altering a pseudo-random bit sequence for scan-based BIST," Proc. ITC, pp. 167-175, 1996.

K.-H. Tsai, J. Rajski, M. Marek-Sadowska, "Star test: the theory and its applications," IEEE Trans. CAD, vol. 19, pp. 1052-1064, Sep. 2000.

* cited by examiner

COMPRESSION BASED ON DETERMINISTIC VECTOR CLUSTERING OF INCOMPATIBLE TEST CUBES

RELATED APPLICATIONS

This application claims priority to U.S. Provisional Patent Application No. 61/157,684, entitled "Compression Based On Deterministic Vector Clustering Of Incompatible Test Cubes," filed on Mar. 5, 2009, and naming Grzegorz Mrugalski et al. as inventors, which application is incorporated entirely herein by reference.

FIELD OF THE INVENTION

The present invention is directed to testing of Integrated Circuits (ICs). Various aspects of the invention may be particularly useful for test data compression.

BACKGROUND OF THE INVENTION

Increasing demands for high quality test have been driven by ever-expanding reliability needs combined with the ability to handle more complex and diverse designs. As circuits grow in size, it becomes increasingly expensive to maintain high level of test coverage. This is due to prohibitively large volumes of test data and long test application times. A method employed to reduce the amount of test data is, therefore, instrumental in maintaining the overall high efficiency of a testing scheme. On-chip test compression has already established itself as a mainstream DFT (design for test) methodology with a direct bearing on the manufacturing test cost.

A majority of existing test compression schemes, including the LFSR (linear feedback shift register) coding, take advantage of low test cube fill rates. They treat external test data as Boolean variables and create linear expressions filling conceptually all scan cells. Test patterns are then delivered, in a compressed and encoded form, through tester channels to an on-chip LFSR (decoder). The LFSR expands the compressed test patterns into the actual data and loads them into internal scan chains. The LFSR coding was refined under the name of static LFSR reseeding in a number of approaches. In principle, the static LFSR reseeding computes a seed for each test cube. The encoding capability of these methods is limited by the LFSR size, unless a group of scan slices is encoded per seed. Another drawback is that the loading of the seed and loading/unloading of the scan chains are done in two non-overlapping phases, resulting in inefficient utilization of the tester. This can be alleviated by employing additional shadow registers. One can also modify patterns produced by the LFSR to increase test coverage while reducing the number of seeds. Finally, as the number of specified bits may vary in successive test cubes, variable-length seeds were deployed to improve the encoding efficiency of the conventional static reseeding schemes.

The dynamic LFSR reseeding stands in vivid contrast to its static counterpart. It continuously injects free variables into a decompressor as it loads the scan chains. This shift in compression paradigm, as proposed for the embedded deterministic test (EDT), reduces test cost by providing one to two orders of magnitude reduction in scan test data volume and scan test time. Such a scheme is widely applicable and easy to deploy because it is based on the standard scan/ATPG methodology with a very simple flow. Reduction of both tester scan buffer data volume and scan test time is also accomplished in the schemes based on the On-Product MISR, where a bandwidth overhead for external test response compaction is reduced by on-chip signature generation while still supplying test stimuli from ATE.

Both test application time and test data volume can be reduced by broadcasting the same test vector to several scan chains through a single input. To apply this technique, a given test pattern must not contain contradictory values on corresponding cells in different chains loaded through the same input. This can be guaranteed by incorporating the compression-imposed constraints during test generation, e.g., by tying dependent inputs together in the circuit description provided to ATPG.

Other forms of compression are based on XOR networks, hybrid patterns, folding counters, bit flipping, non-linear decompressors, reconfigurable networks, and reuse of scan chains. A Star-BIST reduces the amount of data by using clusters of correlated test patterns. A test generator stores a small number of vectors which serve as centers of clusters, and it applies each center test vector multiple times. Every time the center vector is shifted into the circuit, some of its positions are randomly or deterministically complemented. A separate group of techniques uses various forms of compression based on run-length, statistical, constructive, and Golomb codes. Though usable on any set of test cubes, the code-based methods are less than efficient at exploiting test cube low fill rates Test compression schemes are typically characterized by their encoding efficiency, i.e., a ratio of successfully encoded specified bits to the total number of deployed data bits. In particular, the encoding efficiency of plain reseeding-based schemes can reach, at their best, the value of 1.00. The encoding efficiency can be increased either by repeating certain patterns at the rates, which are adjusted to the requirements of test cubes, or by embedding certain bits into LFSR-generated sequences. The latter technique requires additional memory to store compressed information necessary to handle separately test cubes that otherwise would require excessively large LFSRs to be encoded.

Further increase in the encoding efficiency is possible due to regularities occurring in test patterns. Dictionary-based approaches exploit the fact that certain vector values within test patterns are likely to be repeated. When they do occur, they may be encoded as pointers to on-chip memory locations storing vectors reused during test. The similar concept is used in packet-based encoding and nine-coded compression. The recently proposed restrict encoding combines LFSR reseeding with a pre-computed dictionary of test vector values which are injected at the same positions over multiple test patterns. The approach requires, however, solving the clique covering and traveling salesman problems.

BRIEF SUMMARY OF THE INVENTION

Aspects of the invention relate to test data compression based on deterministic vector clustering of incompatible test cubes. In various embodiments of the invention, a parent pattern is formed by clustering a set of test cubes in the presence of conflicting bits but with the numbers of conflicting bits between the parent pattern and any of the test cubes not greater than a pre-determined value. A control pattern and a set of incremental patterns are determined based on the parent pattern and the set of test cubes. The control pattern stores data regarding locations of incremental bits and specified bits. Each of the incremental patterns keeps values for some or all of the incremental bits for one of the set of test cube. According to some embodiments of the invention, a parent pattern may need to be modified if it can not be encoded. An encoding algorithm may partition a control pattern into several blocks to take advantage of its unique structure. Loading test data to scan chains may be accomplished by a tri-modal decompressor.

DETAILED DESCRIPTION OF THE INVENTION

Various aspects of the present invention relate to test data compression. In the following description, numerous details are set forth for purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or a networked computer.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" "cluster," and "merge" to describe the disclosed methods. Such terms are high-level abstractions of the actual operations that are performed. The actual operations that correspond to these terms will vary depending on the particular implementation and are readily discernible by one of ordinary skill in the art.

Operating Environment

Figure 1:
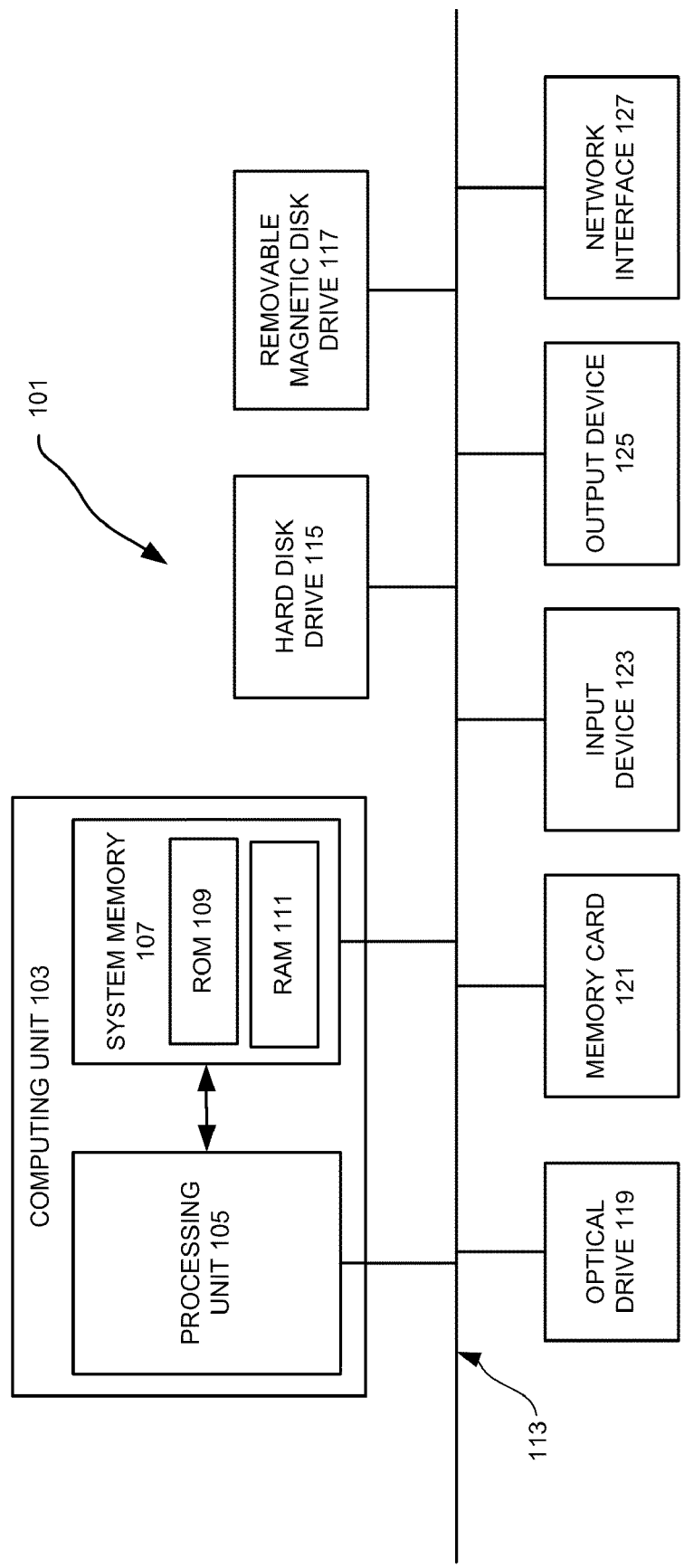
FIG. 1 illustrates a programmable computer system with which various embodiments of the invention may be employed.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Merging Test Cubes in the Presence of Conflicts

Typically, the EDT (embedded deterministic test)-based compression uses cube merging to reduce a pattern count, and hence the ATE (automated test equipment) time and the amount of test data. A conventional cube merging process terminates when either no new compatible cube can be found in a reasonable amount of time, or the resultant pattern cannot be encoded anymore. Here, two test cubes are compatible if in every position where one of the cubes has a value of 0 or 1, the other one either features the same value or don't care.

In accordance with various embodiments of the present invention, a set of test cubes are merged, even in the presence of conflicts, to a pattern (referred to as parent pattern) which is then EDT-compressed. Accordingly, a parent pattern may include three types of bits: incremental bits, specified bits and don't cares. The incremental bits are conflicting bits between the parent pattern and one of the set of test cubes. The specified bits represent the non-conflicting bits whose values have been specified. The don't cares are those non-conflicting bits that can be either 1 or 0.

The data regarding locations of the incremental bits for a parent pattern is referred to as a control pattern. The control pattern also includes data regarding the locations of specified bits of the parent pattern. The data regarding values of incremental bits for a test cube is called an incremental pattern. Only test cubes having conflicting bits with the parent pattern need incremental patterns. A test controller may deliver tests by repeatedly applying the same parent pattern, every time using a different incremental pattern.

The maximal number of incremental bits may be pre-determined. By allowing some degree of incompatibility, more test cubes may be merged according to various embodiments of the invention. Only data necessary to recreate (decompress) the parent pattern as well as information regarding locations of the specified and incremental bits of the parent pattern and values of the incremental bits for a set of test cubes need to be encoded. There is no need to store the entire set of test cubes.

Figure 2:
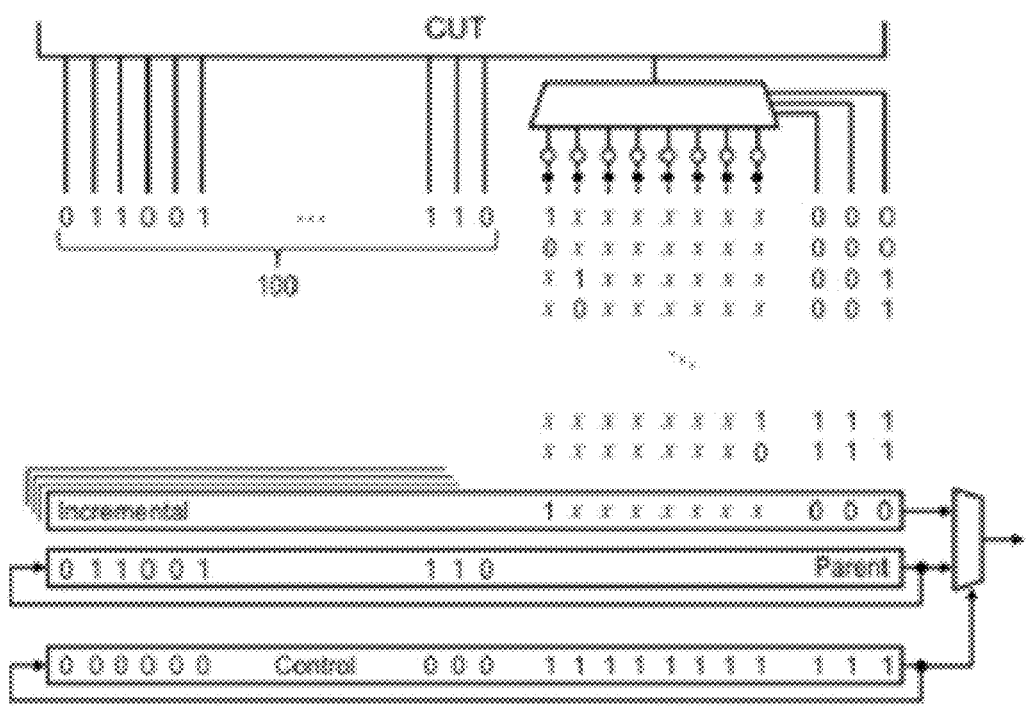
FIG. 2 illustrates a compression scheme in accordance with some embodiments of the invention.

FIG. 2 illustrates principles of some embodiments of the invention. Consider a circuit under test with 111 inputs as shown in the figure. A part of this device is an 8-input multiplexer. In order to detect stuck-at-0 and stuck-at-1 faults on its inputs, one needs to apply test patterns listed in the figure. It is worth noting that these patterns cannot be merged in a conventional way as they all feature mutual conflicts either on data or control lines of the multiplexer. As a result, a conventional compression scheme would need to handle 16 separate test patterns by encoding 16×(100+4)=1664 specified bits. Since 100 specified bits are identical in all vectors, they can be used to form a parent pattern according to some embodiments of the invention, while conflicting bits will occur in successive 16 incremental patterns. Their use is determined by a single control pattern driving a multiplexer put in the front of a scan chain. Clearly, the number of specified bits that have to be encoded is now equal to 100 (parent)+64 (incremental bits)+111 (control)=275. As can be easily verified, the reduction ratio with respect to the conventional EDT is roughly 6.05. Here, the parent pattern and the corresponding control pattern must be applied 16 times for all incremental vectors.

Figure 3:
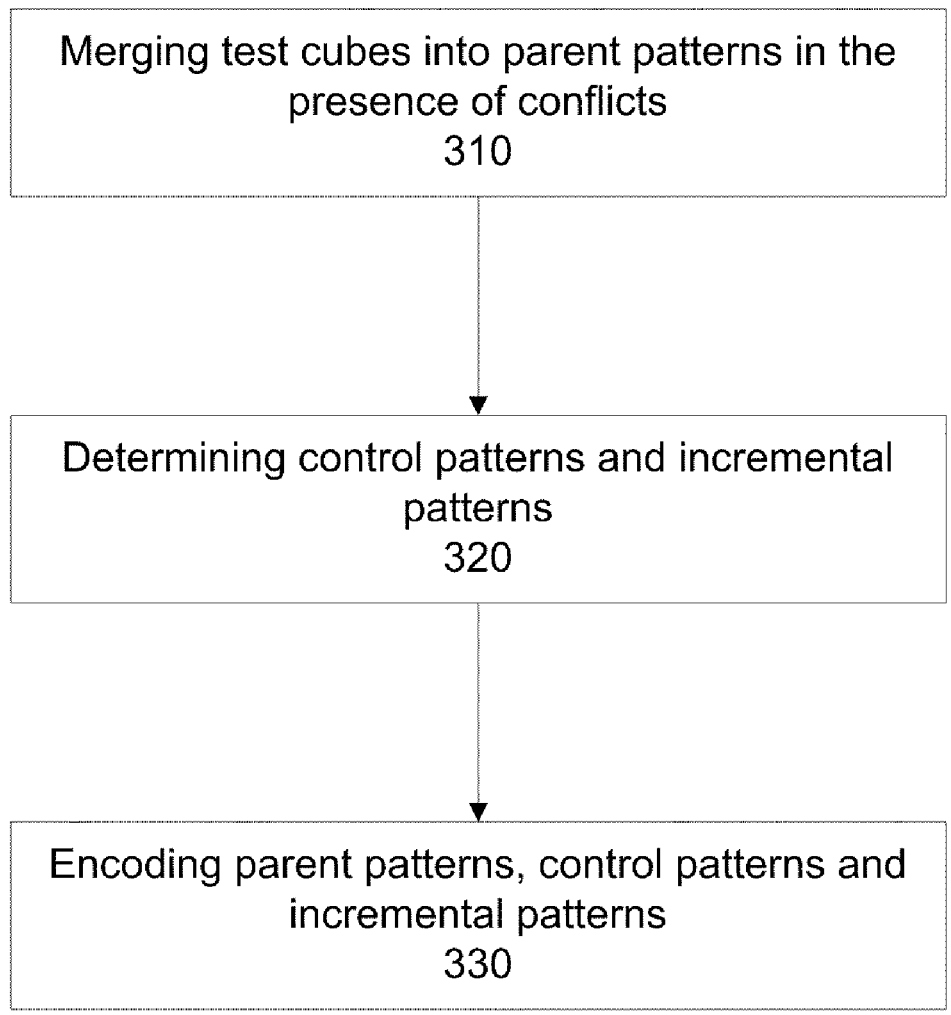
FIG. 3 illustrates a process for test data compression in accordance with some embodiments of the invention.

FIG. 3 illustrates three major steps of the compression process according to some embodiments of the invention. In step 310, a set of parent patterns and all incremental bits associated with every parent pattern are determined based on a degree $\delta$ of allowed conflicts. In step 320, for each parent pattern, a single control pattern and a set of incremental patterns are determined. In step 330, the parent patterns, the control patterns and the incremental patterns are encoded.

Bits of the parent pattern may assume one of the following four values: 0, 1, x, or C. Clearly, the Boolean values of 0 and 1 represent the specified bits assuming these exact values. x is don't care, while C is assigned to positions on which at least one conflict has been recorded. A conflict occurs in two cases: (1) two corresponding bits have the opposite specified values, (2) one bit is specified while the other is already labeled as C.

In accordance with some embodiments of the invention, the three steps shown in FIG. 3 may not be separate but interwoven. Pick a test cube to instantiate a parent pattern P. For every remaining test cube $\tau$, determine the number of specified bits that this cube has in common with the parent pattern. Also, check P and $\tau$ to determine if their number of conflicting bits is greater than $\delta$. If it is, delete $\tau$ from the list of cubes that could be merged with P. Moreover, check all test cubes that have already been integrated with P to determine the number of conflicting bits they would have with P, if $\tau$ was a part of P. Again, if at least one of these numbers is greater than $\delta$, delete $\tau$ from the list.

Subsequently, scan the entire list of candidate test cubes and pick a few of them with the highest degree of similarity with the current parent pattern (the largest number of common specified bits). Merge the first selected test cube with P and try to encode a newer version of P with C-bits being ignored. If the encoding fails, verify whether P can be compressed with some of newly added specified bits discarded and treated as conflicting bits. This can only be done provided the total number of conflicts does not exceed $\delta$. Otherwise, take the next candidate from the short list. The process of forming the parent pattern terminates when none of the short-listed test cubes can be used. If a test cube is successfully added to the parent pattern, compatibility statistics regarding the remaining test cubes are updated and the process continues until no test cubes can be chosen due to incompatibility constrains imposed by factor $\delta$. One of the unmerged test cubes becomes now an initial form of a new parent pattern, and the algorithm proceeds as above. The process finally terminates when no new parent patterns can be formed.

The following example illustrates the above process. Consider a parent pattern:

P x 0 x x x x 1 x x x x x x x x C x 1 x x 0 x

This particular parent pattern was obtained after merging the following three test cubes:

1 x 0 x x x x x x x x x x x x x 1 x x x x 0 x
2 x 0 x x x x 1 x x x x x x x x 1 x x x x x x
3 x x x x x x 1 x x x x x x x x 0 x 1 x x 0 x

Let the allowed level of conflicts be two ($\delta=2$). The process of merging considers now other six test cubes as possible candidates for merging. They are listed below. Each test cube is accompanied by its degree of compatibility $\chi$ (the number of common specified bits with the parent pattern) as well as the number $\Delta$ of conflicts with the parent pattern:

|   |                                   | $\chi$ | $\Delta$ |
|---|-----------------------------------|--------|----------|
| 1 | x x x x x x 0 x x x x x x x x 1 x x x x x x | 0 | 2 |
| 2 | x 0 x x x x x x x x x x x 1 x x 1 x x x x   | 2 | 0 |
| 3 | x 1 x x x x 1 x x x x x x x x 0 x x x x x x | 1 | 2 |
| 4 | x 0 x x x x 1 x x x x x x x x x 0 x x 0 x   | 3 | 1 |
| 5 | x 1 x x x x 0 x x x x x x x x x x x x x 1 1 | 0 | 3 |
| 6 | x 1 x x x x 1 x x x x x x 1 1 x 1 x x 0 x   | 3 | 2 |

The fifth test cube must be rejected as its number of conflicts with the parent pattern (in this particular case $\Delta=3$) is too high. The best candidate seems to be the fourth test cube. It has the same three specified bits as the parent pattern. Also, it features only one conflict. If merged, it would increase the number of conflicts for one of already merged cubes by one, so this is acceptable. It remains to be seen, however, whether the new parent pattern can be encoded or compressible. If so, the new parent pattern is accepted, compatibility statistics for the remaining test cubes are updated, and the process continues.

Once all parent patterns and the incremental bits are known, the corresponding control data can be determined. Let $p_i$ and $c_i$ denote the i-th bit of the parent pattern and the control pattern, respectively. Bits of the control pattern are then defined as follows:

$$p_i=0 \text{ or } p_i=1 \Rightarrow c_i=0,$$

$$p_i=C \Rightarrow c_i=1,$$

$$p_i=x \Rightarrow c_i=x.$$

The control pattern assumes the value of 0 every time the parent pattern features a specified value. Its value of 1 indicates that the parent pattern has a conflicting bit, and therefore the test data should be provided by the incremental pattern. The incremental pattern, in turn, features the specified bits of 0 and 1 on some of the positions where $p_i$=C.

The following is another example which shows a parent pattern, the corresponding control pattern and one of the incremental patterns:

parent pattern:
   x x x C x 1 x x x x x x 0 x x x x x x x C x x x x x x x x x x x
   x x x x x x x x 1 x x x x x x x x x 1 x x x x x x x x 0 0 x x x
   x 1 x x x x x x x x x x x 0 x x x x x x C C x 1 x x x x x x x x
   x x x 0 x x x x x C x x x x x x x x x x x x x x x x x x 1 x x x
   x x x x x x x x x x x x x x x x C x x x x x x x x x x x x x x x control pattern:
   x x x 1 x 0 x x x x x x 0 x x x x x x x 1 x x x x x x x x x x x
   x x x x x x x x 0 x x x x x x x x x 0 x x x x x x x x 0 0 x x x
   x 0 x x x x x x x x x x x 0 x x x x x x 1 1 x 0 x x x x x x x x
   x x x 0 x x x x x 1 x x x x x x x x x x x x x x x x x x 0 x x x
   x x x x x x x x x x x x x x x x 1 x x x x x x x x x x x x x x x incremental pattern:
   x x x 1 x x x x x x x x x x x x x x x x 0 x x x x x x x x x x x
   x x x x x x x x x x x x x x x x x x x x x x x x x x x x x x x x
   x x x x x x x x x x x x x x x x x x x x x x x x x x x x x x x x
   x x x x x x x x x 0 x x x x x x x x x x x x x x x x x x x x x x
   x x x x x x x x x x x x x x x x 1 x x x x x x x x x x x x x x x For the incremental pattern, the specified bits are chosen arbitrarily just for the sake of illustration; note also that only a subset of C-bits is typically covered by a single incremental pattern as the control pattern serves all incremental patterns associated with a given parent pattern.

It is worth noting that test application time in various embodiments of the invention depends on how many times each parent pattern is applied. This is determined by the number of test cubes that have been merged with a given parent pattern despite conflicts (the compatible test cubes do not require any further action besides just a single application of their parent pattern). Compatible incremental vectors of the same parent pattern may be merged to further reduce test application time. This can be easily achieved by inspecting successive lists of incremental patterns to determine maximal sets of pair-wise compatible vectors. One has to make sure, however, that the combined incremental patterns can be still encoded by a method adopted to handle these particular vectors.

Decompressor Architecture

An encoding algorithm is tightly coupled with the architecture of the corresponding decompressor. The latter is presented first as it helps explain how an encoding algorithm works.

Figure 4:
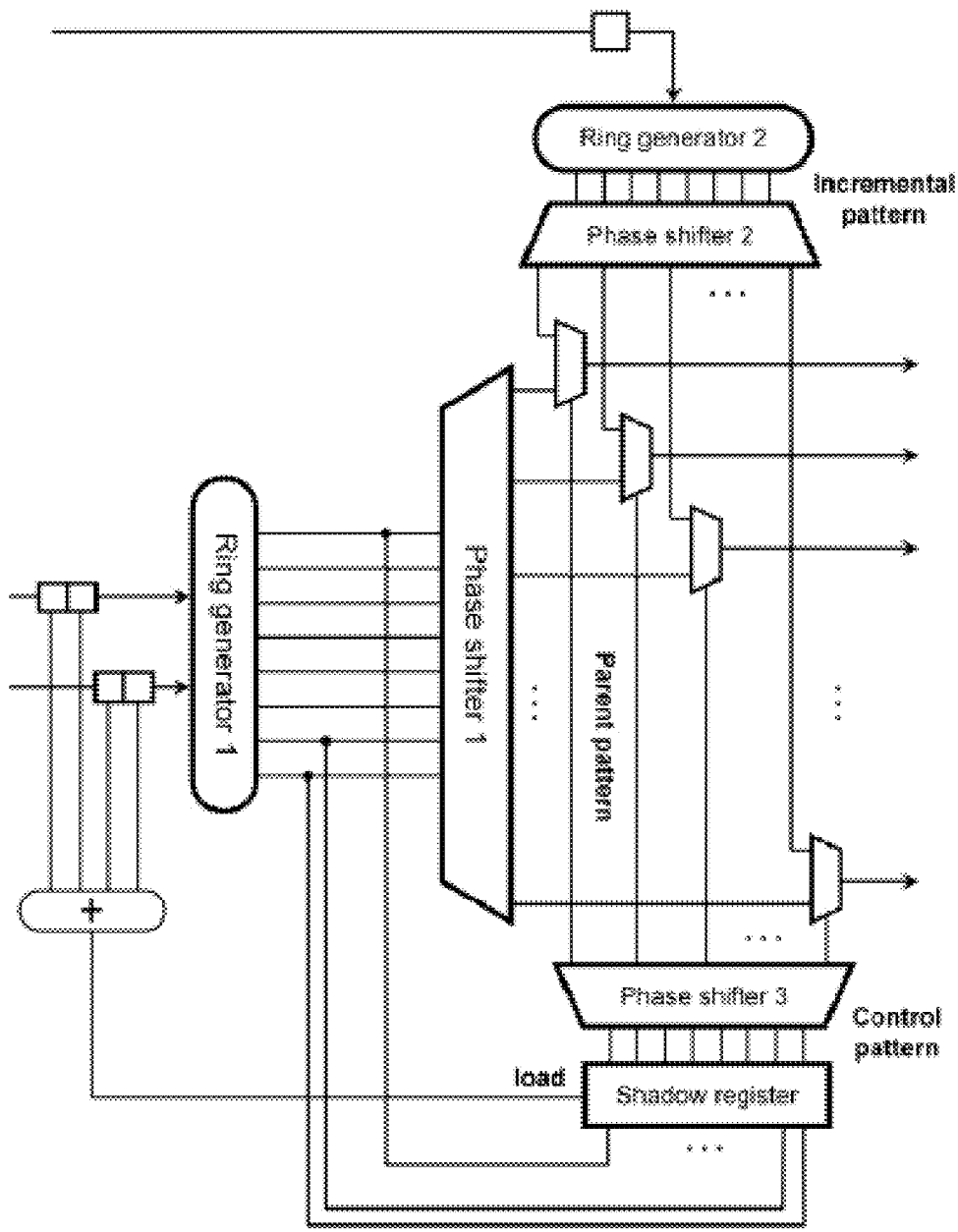
FIG. 4 illustrates the architecture of a decompressor in accordance with some embodiments of the invention.

A decompressor according to some embodiments of the invention essentially comprises three modules designated to decompress parent patterns, incremental patterns, and control patterns, respectively, as shown in FIG. 4. In principle, decompression techniques may follow the EDT-based continuous flow decompression techniques. However, due to particulars characterizing patterns this tri-modal decompressor is to handle, each block is designed in a slightly different way, as described below.

In FIG. 4, a 2-input multiplexer is placed in the front of each scan chain. These devices are intended to route decompressed test data from one of two sources: (1) the basic EDT-like decompressor that primarily handles the parent patterns, (2) another decompressor that takes care of the incremental patterns. The actual source is determined by applying appropriate select signals to the multiplexers. These signals are provided by the third decompression logic employed to handle the control patterns.

Ring generator 1 and phase shifter 1 constitute the first part of the decompression logic. This is virtually a sequential continuous flow decompressor whose logic synthesis and corresponding compression algorithms have already been presented in G. Mrugalski et al., "Ring generators—new devices for embedded test applications," IEEE Trans. CAD, vol. 23, pp. 1306-1320, September 2004, incorporated entirely herein by reference. As mentioned earlier, this part of decompressor is deployed to decode the parent patterns which are subsequently fed to the scan chains unless the control signals decide otherwise.

Control patterns often feature a relatively large number of zeros (corresponding to the specified bits of the parent patterns) with the sparse presence of ones (corresponding to C-bits). To encode such patterns it suffices to target only a small subset of 0-bits as long as they occur in sequences no interspersed with 1-bits. For example, a sequence x x x 0 x x x x 0 x x 0 x x x x x 0 x 1 x x 0 x x x x 0 x x can be efficiently encoded by taking into account only indicated bits, and by assuming that the decompressor outputs are sustained for more than a single clock cycle to deliver the identical test data (here to the multiplexer select inputs) for a number of shift cycles. With such a mechanism, the number of specified bits that need to be encoded is drastically reduced. The same rule applies to 1-bits, though their continuous appearance in control patterns is less frequent.

In order to implement the above idea, a shadow register may be used to keep the decompressor outputs unchanged. It is placed between ring generator 1 and phase shifter 3. The shadow register captures and saves, for a number of cycles, a desired state of ring generator 1, while the generator itself keeps advancing to the next states in order to decode upcoming specified bits. Ring generator 1 is reused as its decoding capabilities are sufficient to handle very low control pattern fill rates.

The decompressor input channels also facilitate the operation of the shadow register by using seed variables to deliver a load enable signal, as shown in FIG. 4. Small buffers placed in parallel with the decompressor inputs drive an XOR tree which computes a parity of input variables, including not only data currently entering the ring generator, but also those used in previous cycles. If this signal is 1, then the shadow register is reloaded with the current content of ring generator 1 before new seed variables enter the generator (and it reaches its next state). Otherwise, the content of the register remains unchanged.

The third part of the decompressor is used to decode the incremental patterns. It includes ring generator 2 and phase shifter 2. As the incremental test patterns feature extremely sparse specified bits (corresponding to C-bits), they do not require all variables, which would be injected within the conventional framework of EDT scheme. Hence, injections of new test data occur regularly in rare and predetermined scan shift cycles only. Such an approach further elevates the compression ratio and adheres conveniently to the ATE ability of repeating the same patterns multiple times. Alternatively, every set of new variables can be injected once, and then buffered, for a requested number of cycles, as shown at the top of FIG. 4.

Other types of decompressors may be employed according to various embodiments of the invention. For example, in order to reduce the ATE channels bandwidth, compressed parent patterns may be delivered to a circuit under test only once, and then stored on chip by deploying either a small memory or certain scan chains acting as circular buffers. Another approach takes advantage of low fill rates allowing several scan chains to be specified bits-free, and, moreover, not affected by fault propagation sites. Indeed, many experimental evidences indicate that a small number of scan chains suffice to accommodate all compressed parent and control patterns. Once the parent pattern is stored, the bandwidth requirements scale down as the incremental patterns need only a fraction of the original tester interface throughput. Possible underutilization of external channels may allow further enhancement of the overall efficiency of deterministic test data compression.

Encoding Algorithm

In accordance with some embodiments of the invention, parent patterns, control patterns and incremental patterns may be compressed using various encoding schemes. For example, specified bits in a parent pattern may be represented by linear functions of variables (C-bits occurring in the parent pattern are not the subject of encoding). To decode the parent pattern represented by linear functions of variables, the variables may be injected into a decompressor. The decompressor uses a ring generator and a phase generator to implement the linear functions, as shown in FIG. 4.

The continuous compression for parent patterns, good as it is, is less efficient in encoding control and incremental patterns because the way how linear equations are created do not capture the more subtle relationships between specified bits in these two types of vectors. Two schemes, building on repetitive sequences and a rare occurrence of certain specified values, may be more effective.

Control patterns exhibit an important feature: 0-bits are predominant specified values while 1-bits occur sparsely. This property is an important factor in reducing the volume of test data as one may deliver the identical data to the multiplexers of a decompressor for a number of scan shift cycles. Consequently, the encoding algorithm may partition a given control pattern into several blocks comprising certain number of consecutive slices such that there are no scan chains with both 0's and 1's inside the same block. This allows one to repeat a given combination many times in succession by using a shadow register storing a state that the ring generator for parent patterns entered at the beginning of a block. Such a technique gives the ring generator enough time to compensate for fading encoding ability by collecting new input variables. They will facilitate successful compression during next steps once the shadow register is reloaded.

The ability of a decompressor to decode data within boundaries of the block determines its size. Hence, the following four rules govern the encoding process according to some embodiments of the invention:

1) it begins with a block and the corresponding state of a ring generator which should be applied first, and it gradually moves towards the end of a control pattern;
2) whenever specified bits of the same value are repeated many times in succession (possibly interspersed with don't care bits) within the same block and the same scan chain, there is no need to encode all of them but the first one;
3) for each scan shift cycle there is an associated equation representing a request to store, if needed, the content of the ring generator in the shadow register before new variables change the state of the generator during the next cycle; and
4) an equation representing the first specified bit in the current block and in a given scan chain is expressed in terms of variables injected until this block.

The last rule is needed as a ring generator state which is to cover a given bit has to be completely determined before it is moved to the shadow register during the first cycle of a next block. This is equivalent to conceptually moving this specified bit to the beginning of the block. As long as such bits can be encoded, the algorithm works by repeatedly increasing the size of the block, and by adding new equations, if necessary. At some point a solution may not exist anymore. This particular time frame is then assigned a new block, and the procedure continues.

Figure 5:
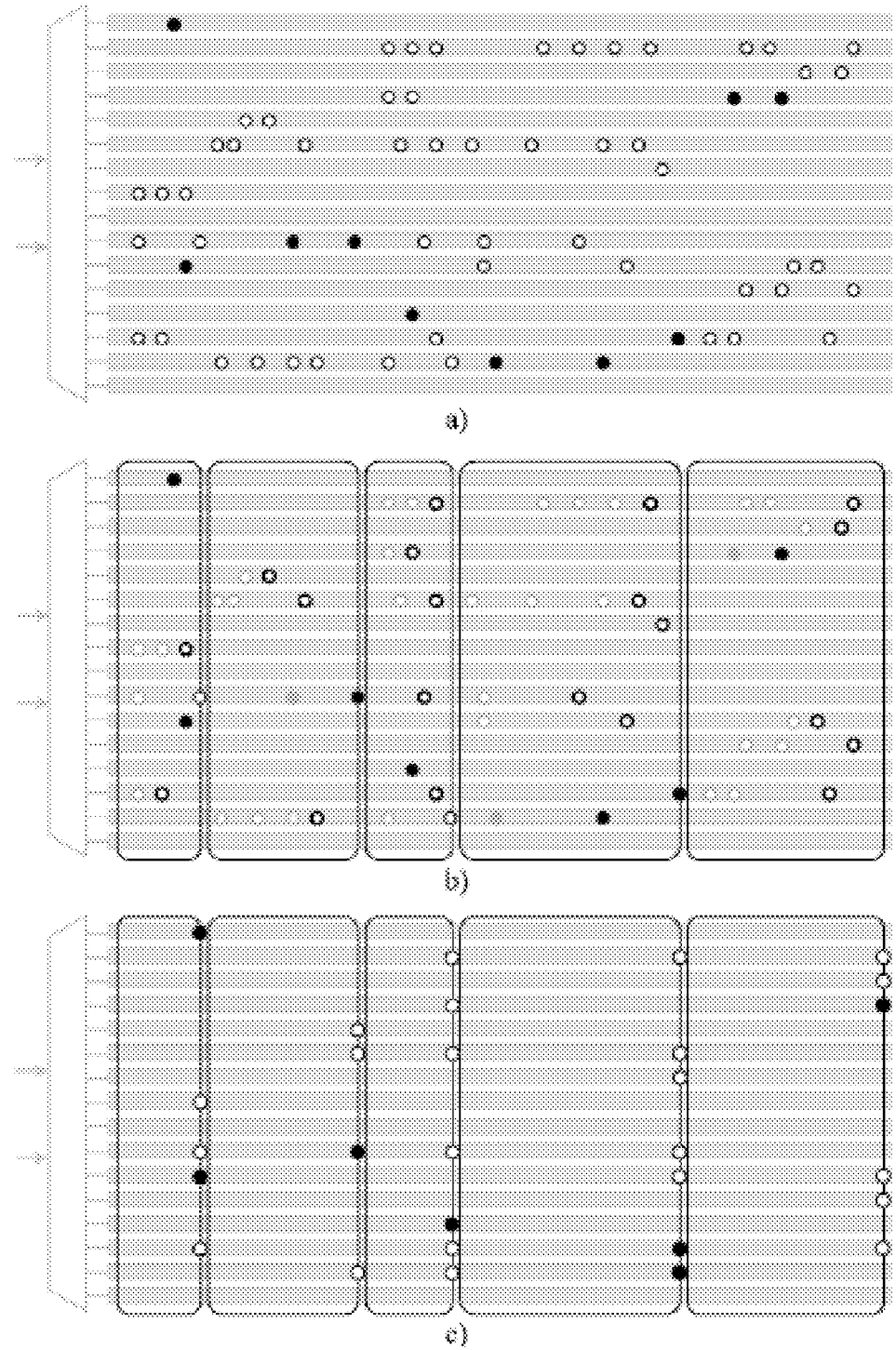
FIG. 5 illustrates compression of control patterns in accordance with some embodiments of the invention.

FIG. 5 illustrates an example of block partitioning. Suppose a control pattern shown in FIG. 5a needs to be encoded (white dots denote 0's while black dots correspond to 1-bits; bits to be considered first are located on the right). Consider a 2-input decompressor employing a shadow register controlled by 4-input XOR gate whose inputs comprise the last two variables injected through each input of the ring generator, as shown in FIG. 4. The input variables $a_0, b_0, a_1, b_1 \ldots$, are provided in pairs. FIG. 5b illustrates a hypothetical partition of the control pattern into blocks with those specified bits that need to be encoded highlighted. By relocating these specified bits to the border lines of the blocks, locations corresponding to linear equations that will be used to perform actual encoding are determined (FIG. 5c). Note that a new block is formed (with the shadow register reloaded) anytime a given scan frame has a conflict with the previous slice. Furthermore, a set of linear equations used by the compression procedure must include one additional equation per every scan slice (time frame) of the following form: $a_k + b_k + a_{k-1} + b_{k-1} = r$, where r is equal to 1, if the shadow register is to be reloaded during the k-th scan shift cycle, and it assumes the value of 0, otherwise. In general, the number of variables used in the above equation depends on the number of decompressor external channels and the size of input buffers, as shown in FIG. 4.

Contrary to the parent and control patterns, the incremental patterns feature very low fill rates. Their compression, therefore, is possible even if only a small subset of variables is employed. In accordance with some embodiments of the invention, the under-sampling rate, i.e., the number of injections repeating the same variables, may be chosen as an integer ratio of the maximal number of variables that might be injected and the number of specified bits. It should be noted that as long as the solver cannot compress an incremental pattern, the whole algorithm repeatedly decreases this rate (until it reaches the value of 1), creates a new set of equations, and invokes the solver again.

The concept of using the subset of variables may be paired with an efficient technique to form linear equations for successive incremental patterns and possibly different values of the under-sampling rate if the solver fails to compress the incremental pattern in the first place. All equations are created initially by assuming that variables are injected every clock cycle. This step may only be done once. Subsequently, equations corresponding to a particular incremental pattern are further modified as follows.

If certain variables are not used, they are replaced with variables injected in the previous scan shift cycle. Suppose two tester channels drive a decompressor. Consider the equation:

$$a_0+b_0+a_1+a_2+b_3=1.$$

If the algorithm is to replace variables injected during the second and fourth steps (i.e., $a_1$, $b_1$, $a_3$, and $b_3$) with variables injected during the first and third cycles (i.e., $a_0$, $b_0$, $a_2$, and $b_2$), then we clearly have:

$$a_0+b_0+a_0+a_2+b_2=b_0+a_2+b_2=1.$$

To accomplish this action in a time-efficient manner, an array of bits to represent variables may be used. The part of each equation corresponding to omitted variables is then added modulo 2, in a bit-wise fashion, to the replacement part. If this way is continued until all variables are examined, the resulting equation will have exactly the same form as the one obtained by symbolic simulation of the decompressor with certain variables repeatedly injected several times. The eliminated variables are eventually replaced with 0s.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of test data compression, comprising:
    receiving a number δ;
    forming a parent pattern by merging a plurality of test cubes such that the number of incremental bits does not exceed the number δ, the incremental bits being conflicting bits between the parent pattern and the plurality of test cubes.

2. The method recited in claim 1, further comprising:
    modifying the parent pattern if the parent pattern can not be encoded and removing a test cube from the plurality of test cubes if the number of conflicting bits of the test cube with the parent pattern exceeds the number δ due to the modification.

3. The method recited in claim 1, further comprising:
    determining a control pattern and a plurality of incremental patterns based on the parent pattern and the plurality of test cubes.

4. The method recited in claim 3, further comprising:
    encoding the parent pattern, the control pattern and the plurality of incremental patterns.

5. The method recited in claim 4, wherein encoding employs an algorithm that partitions the control pattern into a plurality of blocks.

6. The method recited in claim 3, further comprising:
    merging compatible incremental patterns in the plurality of incremental patterns.

7. A device for decompression, comprising:
    a first decompressor unit for parent patterns, the first decompressor unit comprising a first ring generator and a first phase shifter, inputs of the first phase shifter being connected to outputs of the first ring generator;
    a plurality of two-input multiplexers, a first input of each of the plurality of two-input multiplexers being connected to an output of the first phase shifter, an output of each of the plurality of two-input multiplexers being connected to a scan chain;
    a second decompressor unit for incremental patterns, the second decompressor unit comprising a second ring generator and a second phase shifter, inputs of the second phase shifter being connected to outputs of the second ring generator, each output of the second phase shifter being connected to a second input of one of the plurality of two-input multiplexers;
    a third phase shifter for control patterns, outputs of the third phase shifter being connected to select inputs of the plurality of two-input multiplexers;
    a shadow register, inputs of the shadow register being connected to outputs of the first ring generator and outputs of the shadow register being connected to inputs of the third phase shifter; and
    an XOR tree computing a parity of input variables that enter the first ring generator, an output of the XOR tree being connected to a load enable input of the shadow register.

8. A processor-readable medium storing processor-executable instructions for causing one or more processors to perform a method of test data compression, the method comprising:
    receiving a number δ;
    forming a parent pattern by merging a plurality of test cubes such that the number of incremental bits does not exceed the number δ, the incremental bits being conflicting bits between the parent pattern and the plurality of test cubes.

9. The processor-readable medium recited in claim 8, wherein the method of test data compression further comprises:
    modifying the parent pattern if the parent pattern can not be encoded and removing a test cube from the plurality of test cubes if the number of conflicting bits of the test cube with the parent pattern exceeds the number δ due to the modification.

10. The processor-readable medium recited in claim 8, wherein the method of test data compression further comprises:
    determining a control pattern and a plurality of incremental patterns based on the parent pattern and the plurality of test cubes.

11. The processor-readable medium recited in claim 10, wherein the method of test data compression further comprises:
    encoding the parent pattern, the control pattern and the plurality of incremental patterns.

12. The processor-readable medium recited in claim 11, wherein encoding employs an algorithm that partitions the control pattern into a plurality of blocks.

13. The processor-readable medium recited in claim 10, wherein the method of test data compression further comprises:
    merging compatible incremental patterns in the plurality of incremental patterns.

14. A system comprising one or more processors, the one or more processors programmed to perform a method of test data compression, the method comprising:
    receiving a number δ;
    forming a parent pattern by merging a plurality of test cubes such that the number of incremental bits does not exceed the number δ, the incremental bits being conflicting bits between the parent pattern and the plurality of test cubes.

15. The system recited in claim 14, wherein the method of test data compression further comprises:

modifying the parent pattern if the parent pattern can not be encoded and removing a test cube from the plurality of test cubes if the number of conflicting bits of the test cube with the parent pattern exceeds the number δ due to the modification.

16. The system recited in claim 14, wherein the method of test data compression further comprises:

determining a control pattern and a plurality of incremental patterns based on the parent pattern and the plurality of test cubes.

17. The system recited in claim 16, wherein the method of test data compression further comprises:

encoding the parent pattern, the control pattern and the plurality of incremental patterns.

18. The system recited in claim 17, wherein encoding employs an algorithm that partitions the control pattern into a plurality of blocks.

19. The system recited in claim 16, wherein the method of test data compression further comprises:

merging compatible incremental patterns in the plurality of incremental patterns.

* * * * *